United States Patent
Matsuo et al.

(10) Patent No.: US 7,002,424 B2
(45) Date of Patent: Feb. 21, 2006

(54) OSCILLATOR HAVING VOLTAGE DIVIDING CIRCUIT

(75) Inventors: Nobuaki Matsuo, Yokohama (JP); Alejandro Puel, Yokohama (JP)

(73) Assignee: Fujitsu Media Devices Limited, Yokohama (JP)

( * ) Notice: Subject to any disclaimer, the term of this patent is extended or adjusted under 35 U.S.C. 154(b) by 0 days.

(21) Appl. No.: 10/435,042

(22) Filed: May 12, 2003

(65) Prior Publication Data
US 2003/0210100 A1    Nov. 13, 2003

(30) Foreign Application Priority Data
May 13, 2002    (JP)    ............... 2002-137842

(51) Int. Cl.
*H03B 5/18*    (2006.01)
(52) U.S. Cl. ............... 331/167; 331/117 D; 331/117 R
(58) Field of Classification Search ........... 331/117 R, 331/36 C, 117 D, 177 V, 107 A, 167, 158, 331/101, 108 C
See application file for complete search history.

(56) References Cited

U.S. PATENT DOCUMENTS

| | | | | |
|---|---|---|---|---|
| 3,995,233 A | * | 11/1976 | Waku | 331/116 R |
| 4,600,900 A | * | 7/1986 | Renoult et al. | 331/116 R |
| 6,169,461 B1 | * | 1/2001 | Andoh et al. | 331/117 D |
| 6,683,507 B1 | * | 1/2004 | Jeong | 331/117 R |
| 2001/0043125 A1 | * | 11/2001 | Sato | 331/117 R |
| 2002/0135433 A1 | * | 9/2002 | Uchiyama et al. | 331/158 |

FOREIGN PATENT DOCUMENTS

| | | |
|---|---|---|
| JP | 62-173805 | 7/1987 |
| JP | 62-207005 | 9/1987 |
| JP | 7-288425 | 10/1995 |
| JP | 10-13151 | 1/1998 |
| JP | 11-41030 | 2/1999 |
| JP | 2001-24433 | 1/2001 |
| JP | 2001-177342 | 6/2001 |
| JP | 2001-313526 | 11/2001 |

* cited by examiner

*Primary Examiner*—Joseph Chang
(74) *Attorney, Agent, or Firm*—Arent Fox PLLC

(57) ABSTRACT

An oscillator includes a resonance circuit, and a feedback circuit coupled to the resonance circuit. The resonance circuit includes a main resonance element circuit, and a voltage dividing circuit that divides an output voltage of the main resonance element circuit and applies a divided voltage to the feedback circuit.

11 Claims, 8 Drawing Sheets

OSCILLATOR HAVING VOLTAGE DIVIDING CIRCUIT

BACKGROUND OF THE INVENTION

1. Field of the Invention

The present invention generally relates to oscillators, and more particularly, to an oscillator suitable for radio-frequency (RF) circuit.

2. Description of the Related Art

Conventionally, various types of oscillators such as a local oscillator for FM tuners, a crystal oscillator, and a voltage-controlled oscillator are used. A Colpittz oscillator and a Hartley oscillator are known as LC oscillators. The LC oscillator employs a resonance circuit by the combination of an inductor L and a capacitor C. This resonance circuit is capable of generating an oscillation signal over a wide frequency range. The oscillation frequency may be continuously varied by changing the values of the inductor L and capacitor C. However, the oscillation frequency of the LC oscillator fluctuates due to various factors.

For example, a clap oscillator is known as an improved version of the Colpittz oscillator, and has an improved temperature characteristic. The clap oscillator can cover a wide range of a low frequency to VHF (Very High Frequency).

FIG. 1 is a circuit diagram of a conventional circuit configuration of the clap oscillator. Referring to FIG. 1, the clap oscillator has a resonance circuit 1 and a feedback circuit 20. The resonance circuit 1 mainly determines the oscillation frequency, and the feedback circuit 20 mainly determines the oscillating condition. The feedback circuit 20 is made up of an oscillation transistor 21, which is an npn transistor, and feedback capacitors C1 and C2. The feedback capacitor C1 is connected between the base and emitter of the transistor 21, and the feedback capacitor C2 is connected between the emitter and collector thereof. The base of the transistor 21 is connected to the resonance circuit 1. More particularly, the base of the transistor 21 is connected to a main resonance element circuit 11 of the resonance circuit 1 via a clap capacitor C3. The main resonance element circuit 11 may have a self-resonance or series/parallel resonance configuration, which may be realized by a capacitor, an inductor, a diode or a piezoelectric element. The main resonance element circuit 11 is adjusted so that a resonance frequency, which depends on the target application, can be obtained.

The clap capacitor 3 is provided in order to make "coarse" coupling between the main resonance element circuit 11 and the feedback circuit 20. A frequency control terminal 12 is connected to a node at which the main resonance element circuit 11 and the clap capacitor C3 are connected. The frequency control terminal 12 is not an essential element of the resonance circuit 1, and may be omitted. A frequency control voltage applied to the frequency control terminal 12 controls a variable capacitance element in the main resonance element circuit 11. The variable capacitance element may, for example, be a variable capacitance diode. By changing the voltage applied across the variable capacitance diode via the frequency control terminal 12, the oscillation circuit functions as a voltage-controlled oscillator.

Nowadays, the frequency range used in the RF devices is going up as it can be seen from the technical trend in cellular phones or the like, and the individual capacitive elements used in the circuits have reduced values. Generally, there is an increased dispersion of capacitance value as the elements have reduced capacitance values. A serious problem of instability of the circuit operation may arise from an increased dispersion of capacitance. It is therefore required to reduce deviations from the target capacitance values. Particularly, the clap oscillator shown in FIG. 1 employs the main resonance element circuit 11 having a small capacitance value and the feedback capacitors C1 and C2 respectively having small capacitance values. In the clap oscillator, in order to avoid influence on the resonance circuit 1 due to the floating capacitance of the transistor 21 and variation of the load driven by the oscillator, the oscillator is frequently designed to satisfy a condition that the capacitance of the clap capacitor C3 is less than that of the feedback capacitor C1 or C2. Thus, the clap capacitor C3 should have an extreme small capacitance value.

In order to stabilize the oscillation of the clap oscillator with the clap capacitor C3 having an extremely small capacitance value, it is essential to realize reduced dispersion of the capacitance thereof. However, in practice, the floating capacitance of the transistor 21 and variation in the capacitance of the feedback capacitor C1 or C2 may be changed due to variation in the power supply voltage and the ambient temperature. In the case where the main resonance element circuit 11 includes an element that changes the impedance of the resonator in response to an external signal, such as a variable capacitance diode or a crystal vibrator, the tolerable range of the capacitance of the clap capacitor 3 in which the stable circuit operation can be secured can be determined with respect to change of the impedance of the resonance circuit 1 and change of the impedance of the transistor 21. However, there is a limit on reduction of dispersion of capacitance because of an extremely small capacitance of the clap capacitor C3, and such reduction may sometimes be inappropriate in terms of mass productivity.

More particularly, in case where the ratio between the impedance of the main resonance element circuit 11 that is changed by the frequency control voltage applied to the frequency control terminal 12 and the impedance of the clap capacitor C3 is always constant, the impedance of the resonance circuit 1 viewed from the feedback circuit 20 will have only a small change. However, in practice, the ratio is not always constant due to dispersion of impedance of the main resonance element circuit 11 and that of the clap capacitor C3, and the impedance viewed from the feedback circuit 20 varies. Thus, the whole oscillator has a characteristic described by B1 or B2 shown in FIG. 2, in which the horizontal axis denotes the frequency control voltage applied to the frequency control terminal 12, and the vertical axis denotes the C/N (Carrier-to-Noise ratio). As shown in FIG. 2, the C/N ratio changes greatly as the function of the frequency control voltage (that is, the frequency). Further, there is dispersion of the characteristic so that some oscillators have the C/N characteristic B1 or similar thereto, and some oscillators have the C/N characteristic B2 or similar thereto.

SUMMARY OF THE INVENTION

It is a general object of the present invention to provide an oscillator in which the above disadvantages are eliminated.

A more specific object of the present invention is to provide an oscillator having stabilized oscillation and an improved C/N ratio.

The above objects of the present invention are achieved by an oscillator including: a resonance circuit; and a feedback circuit coupled to the resonance circuit, the resonance circuit including: a main resonance element circuit; and a voltage dividing circuit that divides an output voltage of the main resonance element circuit and applies a divided voltage to the feedback circuit.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description will now be given of preferred embodiments of the present invention with reference to the accompanying drawings.

(First Embodiment)

Figure 1:
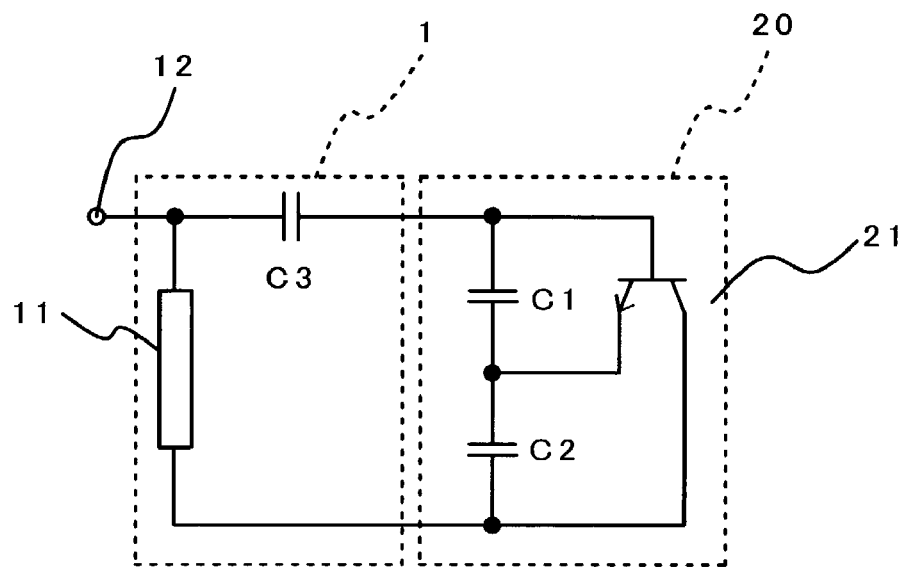
FIG. 1 is a circuit diagram of a conventional clap oscillator.
Figure 3:
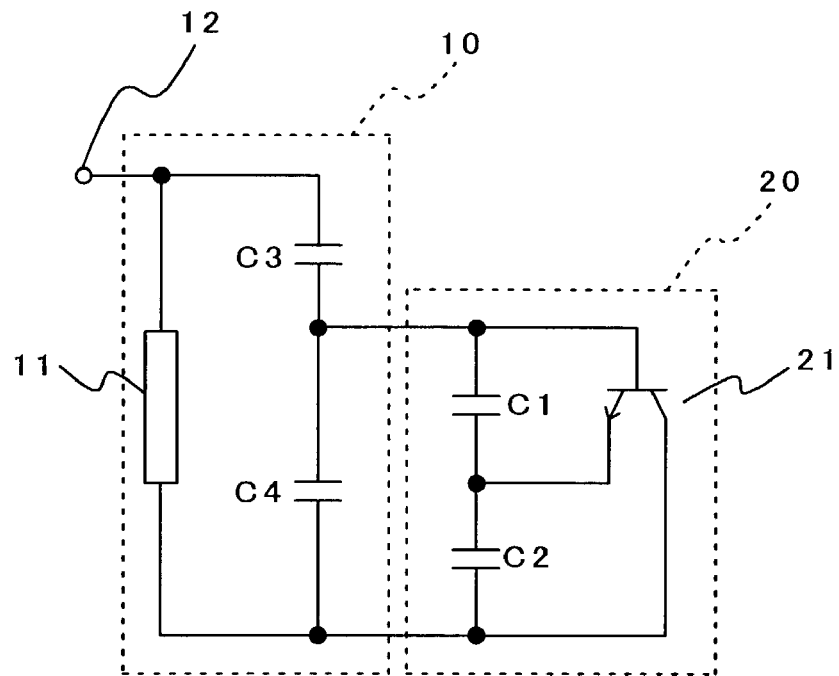
FIG. 3 is a circuit diagram of an oscillator according to a first embodiment of the present invention.

FIG. 3 is a circuit diagram of an oscillator according to a first embodiment of the present invention, in which the same reference numerals as those in FIG. 1 refer to the same elements.

The oscillator is equipped with a resonance circuit 10 and the aforementioned feedback circuit 20. The feedback circuit 20 includes the oscillation transistor 21 and the feedback capacitors C1 and C2. The resonance circuit 10 is newly equipped with a capacitor C4 in addition to the aforementioned main resonance element circuit 11 and the capacitor C3. More particularly, the oscillator shown in FIG. 3 is configured as follows. The feedback circuit 20 is made up of the transistor 21 and the first capacitor C1 coupling the emitter of the transistor 21 serving as a first terminal and the base thereof serving as a control terminal, and the second capacitor C2 coupling the collector of the transistor 21 serving as a second terminal and the emitter. The resonance circuit 10 includes a series circuit of the third capacitor C3 coupling one end of the main resonance element circuit 11 and the base of the transistor 21, and the fourth capacitor C4 coupling the other end of the main resonance element circuit 11 and the base of the transistor 21.

The capacitors C3 and C4 serve as a voltage dividing circuit, and divide the output voltage of the main resonance element circuit 11. A divided voltage thus obtained is applied to the feedback circuit 20. The capacitors C3 and C4 form the series circuit serving as a voltage dividing circuit, and its intermediate node, namely, the node between the capacitors C3 and C4 is connected to the base of the transistor 21. One end of the series circuit is connected to one end of the main resonance element circuit 11 and the frequency control terminal 12, and the other end thereof is connected to the other end of the main resonance element circuit 11. The output voltage (resonance signal) is divided by the combination of the capacitors C3 and C4, and the divided voltage thus obtained is applied to the base of the transistor 21. The other end of the main resonance element circuit 11 to which the capacitors C2 and C4 are connected may be grounded.

By dividing the output voltage of the main resonance element circuit 11 and applying the divided voltage to the base of the transistor 21, the base potential can be stabilized with respect to a change of the frequency control voltage applied via the frequency control terminal 12, so that a change of the ratio between the impedance of the resonance circuit 10 and that of the feedback circuit 20 can be reduced. In this regard, the voltage dividing circuit composed of the capacitors C3 and C4 is means for controlling the impedance ratio between the resonance circuit 10 and the feedback circuit 20. Even if there are deviations from the designed values of the circuit elements shown in FIG. 3, the change of the base voltage can be relatively reduced because the voltage obtained by dividing the output voltage of the main resonance element circuit 11 rather than the output voltage itself is applied to the base of the transistor 21. That is, the voltage dividing circuit can absorb variation of the base voltage because of the deviations of the circuit elements from the designed values. As a result, there is a smaller difference in performance among the oscillators due to the deviations of the circuit elements from the designed values introduced during the production process.

Figure 2:
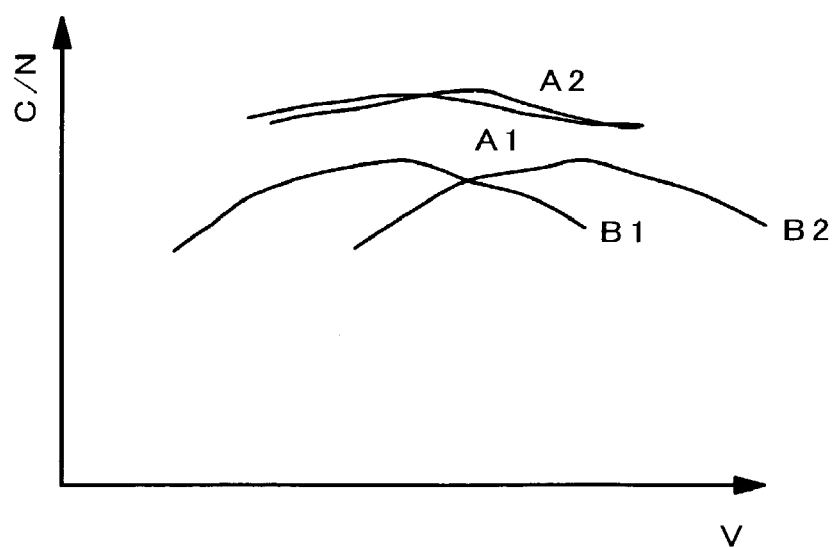
FIG. 2 is a graph showing a C/N ratio of the conventional oscillator as the function of a frequency control voltage and that of an oscillator according to an embodiment of the present invention.

Curves A1 and A2 shown in FIG. 2 respectively denote C/N characteristics as the function of the frequency control voltage (frequency) of two oscillators according to the first embodiment of the present invention. The characteristics A1 and A2 have small variations in the C/N ratio as the function of the frequency control voltage, as compared to the conventional characteristics B1 and B2. In addition, the characteristics A1 and A2 do not have great difference. It can be seen from the above that the stability of the oscillators according to the present embodiment can be improved. The improvement in the stability of oscillation can be achieved merely by adding the capacitor C4 to the capacitor C3 in series. Thus, the oscillators according to the present embodiment are advantageous in terms of mass productivity and production cost.

The setting of the ratio in capacitance between the capacitors C3 and C4 may be designed so that an appropriate impedance ratio between the resonance circuit 10 and the feedback circuit 20 can be realized.

Figure 4:
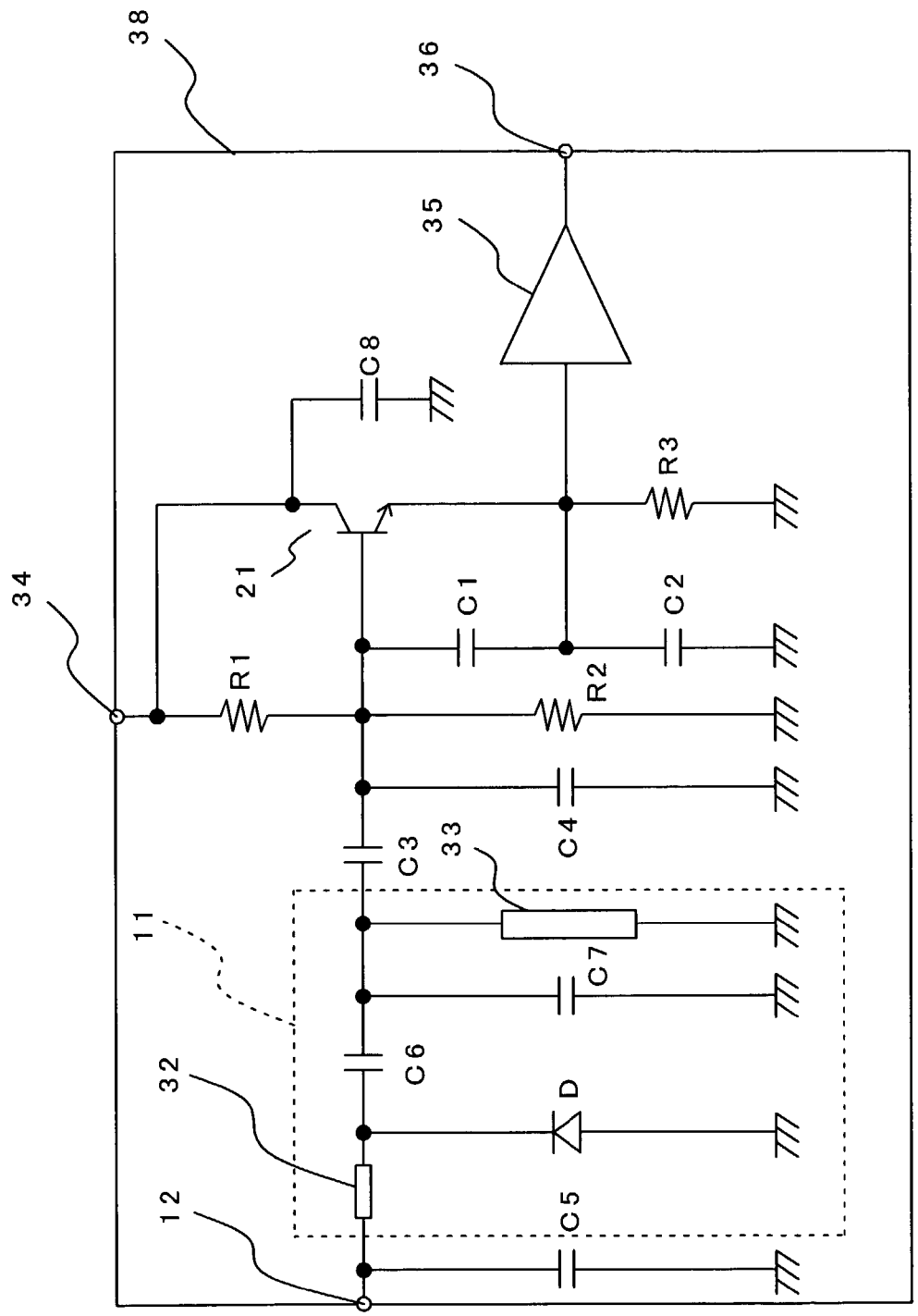
FIG. 4 is a circuit diagram of a more detailed structure of the oscillator shown in FIG. 3.

A bias circuit for the transistor 21, which is a dc circuit, is omitted from FIG. 3 for the sake of simplicity. As is shown in FIG. 4, the bias circuit mentioned above and other circuit elements are provided to the circuit configuration shown in FIG. 3. In FIG. 4, the same reference numerals as those described previously refer to the same elements. The resistors R1, R2 and R3 form the bias circuit for the transistor 21. The resistors R1 and R2 define the bias voltage applied to the base of the transistor 21. The resistors R1 and R2 are connected between a power supply terminal 34 and the ground in series, and applies a divided voltage to the base of the transistor 21. The resistor R3 biases the emitter of the transistor 21, and is connected between the emitter thereof and the ground.

The main resonance element circuit 11 includes an inductor 32, a variable capacitance diode D, capacitors C6 and C7, and an inductor 33. The anode of the variable capacitance diode D is grounded, and the cathode thereof is supplied with the frequency control voltage via the frequency control terminal 12 and the inductor 32. The capacitance of the variable capacitance diode D depends on the frequency control voltage. The inductor 32 functions as a choke coil that cuts off high-frequency current. The inductor 32 may be replaced with a resistor. The cathode of the variable capacitance diode D is coupled to one end of the inductor 33 in the ac circuit. The capacitor C6 is provided to cut off the dc component. The variable capacitance diode D, the capacitor C7 and the inductor 33 are structural elements of the resonance circuit. A capacitor C5 allows the high-frequency current to flow to the ground, and supplies the main resonance element circuit 11 with the frequency control voltage, which is the dc voltage. The capacitor CS may be omitted as necessary.

The main resonance element circuit 11 is not limited to the circuit configuration shown in FIG. 4. For example, the capacitor C7 may be omitted.

An oscillation frequency available at the emitter of the transistor 21 is linearly amplified by a buffer amplifier 35, and an amplified signal is output to the outside of the oscillator via an output terminal 36. Thus, the oscillation output is boosted to an appropriate output level. A capacitor C8 connected between the collector of the transistor 21 and the ground is provided so that the impedance of the collector can define the optimal oscillation condition.

The oscillator shown in FIG. 4 may be realized on a semiconductor chip 38. The circuit elements shown in FIG. 4 may be formed on the semiconductor chip 38. For example, the inductors 32 and 33 may be formed by utilizing a transmission line such as microstrip line or a strip line formed on a semiconductor substrate or chip. The capacitors C1–C8 may be MIM (Metal Insulator Metal) capacitors or interdigital capacitors. Preferably, the semiconductor chip 38 may be packaged by resin or the like. In this regard, the reference numeral 38 indicates a package that hermetically seals the semiconductor chip 38. The packaged oscillator is a semiconductor device that may be used for various applications. The frequency control terminal 12, the power supply terminal 34 and the output terminal 36 are attached to the package 38. Although not illustrated for the sake of simplicity, a ground terminal is attached to the package 38. The circuit configuration of the oscillator shown in FIG. 4 may be realized so that some circuit elements are provided outside of the semiconductor chip or package 38. The main resonance element circuit 11 may use a vibrator having variable impedance controlled by an external voltage, such as a crystal vibrator or a ceramic vibrator. The main resonance element circuit 11 may also be formed by other appropriate circuit elements.

The main resonance element circuit 11 is an LC parallel resonance circuit, which may be designed to have a configuration other than that shown in FIG. 4. The main resonance element circuit 11 may be an LC series resonance circuit or an RC resonance circuit wherein resistors and capacitors are combined so as to form a ladder arrangement.

Figure 5:
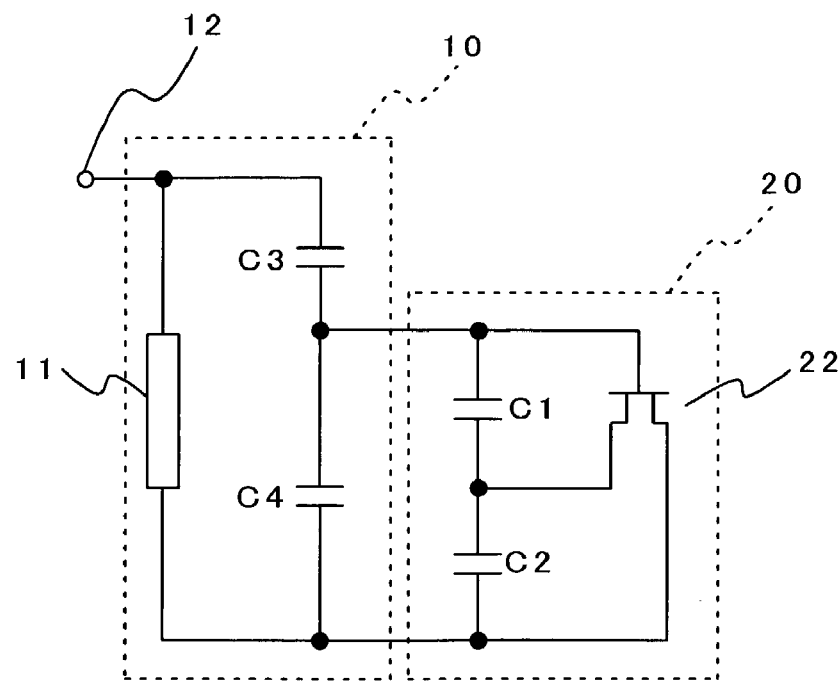
FIG. 5 is a circuit diagram of a variation of the oscillator shown in FIG. 3.

As shown in FIG. 5, a field effect transistor (FET) 22 may be used instead of the npn bipolar transistor 21.

(Second Embodiment)

Figure 6:
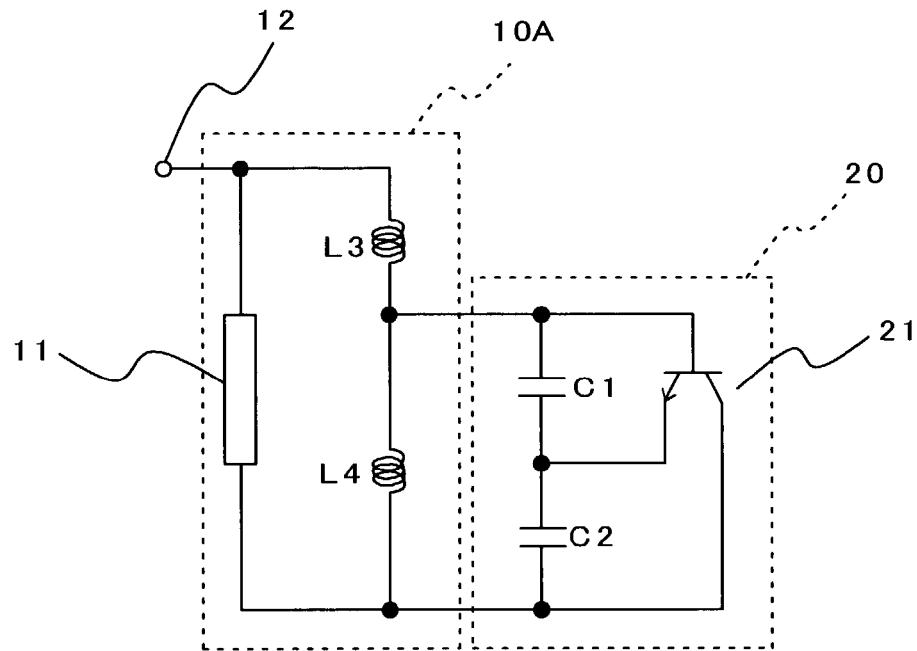
FIG. 6 is a circuit diagram of an oscillator according to a second embodiment of the present invention.

FIG. 6 is a circuit diagram of an oscillator according to a second embodiment of the present invention, in which the same reference numerals as those described previously refer to the same elements.

A resonance circuit 10A has inductors L3 and L4, which are substituted for the capacitors C3 and C4, respectively. More particularly, the oscillator shown in FIG. 6 is configured as follows. The feedback circuit 20 is made up of the transistor 21 and the first capacitor C1 coupling the emitter of the transistor 21 serving as the first terminal and the base thereof serving as the control terminal, and the second capacitor C2 coupling the collector of the transistor 21 serving as the second terminal and the emitter. The resonance circuit 10A includes a series circuit of the first inductor L3 coupling one end of the main resonance element circuit 11 and the base of the transistor 21, and the second inductor L4 coupling the other end of the main resonance element circuit 11 and the base of the transistor 21.

The inductors L3 and L4 divide the output voltage of the main resonance element circuit 11, a divided voltage being applied to the feedback circuit 20. The inductors L3 and L4 form the series circuit, and its intermediate node, namely, the node between the inductors L3 and L4 is connected to the base of the transistor 21. One end of the series circuit is connected to one end of the main resonance element circuit 11 and the frequency control terminal 12, and the other end thereof is connected to the other end of the main resonance element circuit 11. The output voltage (resonance signal) is divided by the combination of the inductors L3 and L4, and the divided voltage thus obtained is applied to the base of the transistor 21. The other end of the main resonance element circuit 11 to which the capacitor C2 and the inductor L4 are connected may be grounded.

By dividing the output voltage of the main resonance element circuit 11 and applying the divided voltage to the base of the transistor 21, the base potential can be stabilized with respect to a change of the frequency control voltage applied via the frequency control terminal 12, so that a change of the ratio between the impedance of the resonance circuit 10A and that of the feedback circuit 20 can be reduced. In this regard, the voltage dividing circuit composed of the inductors L3 and L4 is means for controlling the impedance ratio between the resonance circuit 10A and the feedback circuit 20. Even if there are deviations from the designed values of the circuit elements shown in FIG. 6, the change of the base voltage can be relatively reduced because the voltage obtained by dividing the output voltage of the main resonance element circuit 11 rather than the output voltage itself is applied to the base of the transistor 21. Thus, the influence of the deviations of the circuit elements from the designed values can be reduced.

Figure 7:
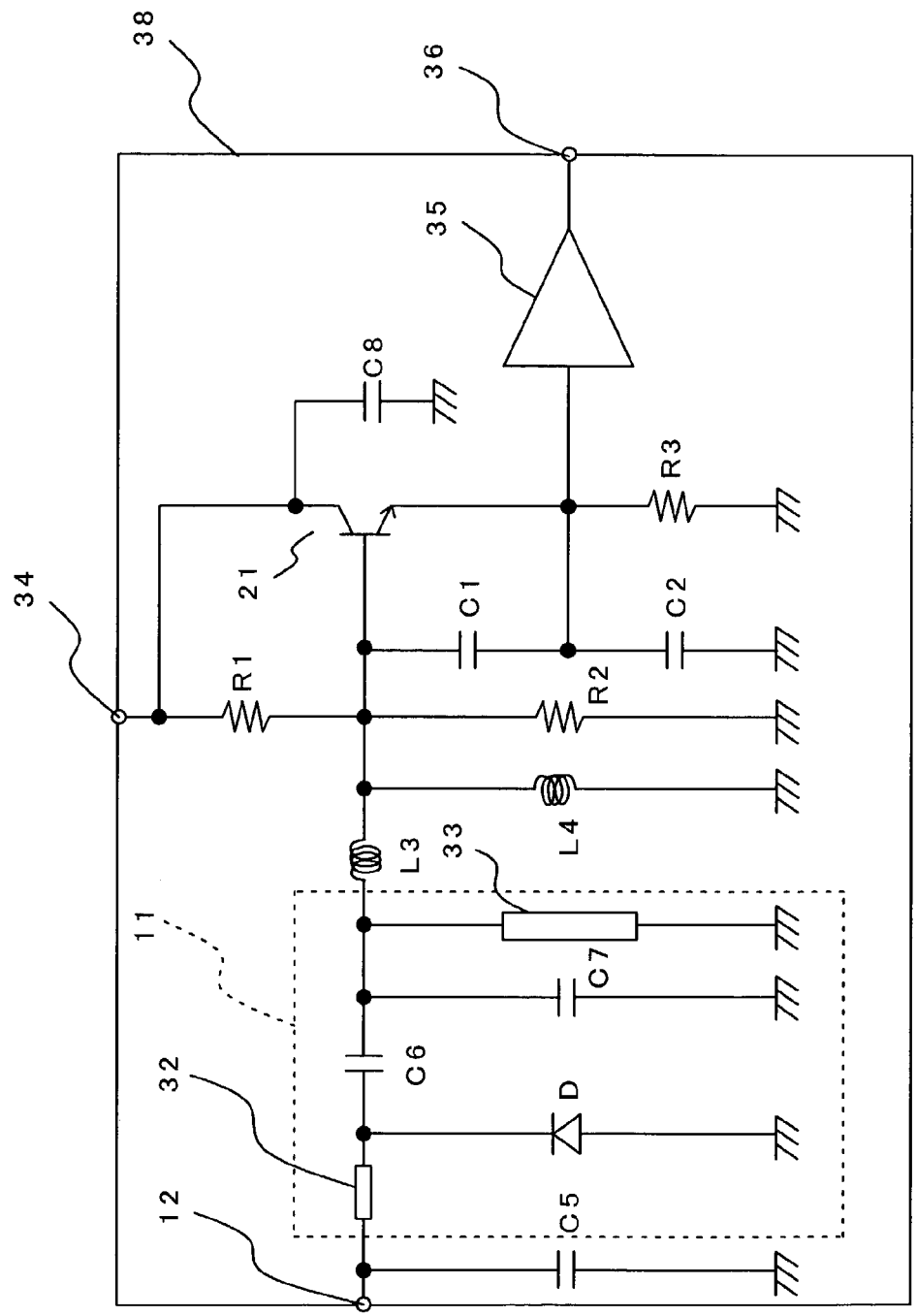
FIG. 7 is a circuit diagram of a more detailed structure of the oscillator shown in FIG. 6.

FIG. 7 shows a detailed circuit configuration of the oscillator shown in FIG. 6, and illustrates the bias circuit for the transistor 21 and an internal configuration of the main resonance element circuit 11 in addition to the circuit configuration shown in FIG. 6. The circuit configuration of FIG. 7 is the same as that of FIG. 4 except that the inductors L3 and L4 are substituted for the capacitors C3 and C4 shown in FIG. 4, respectively.

A field effect transistor may be substituted for the bipolar transistor shown in FIG. 6 or 7 as in the case shown in FIG. 5.

(Third Embodiment)

Figure 8:
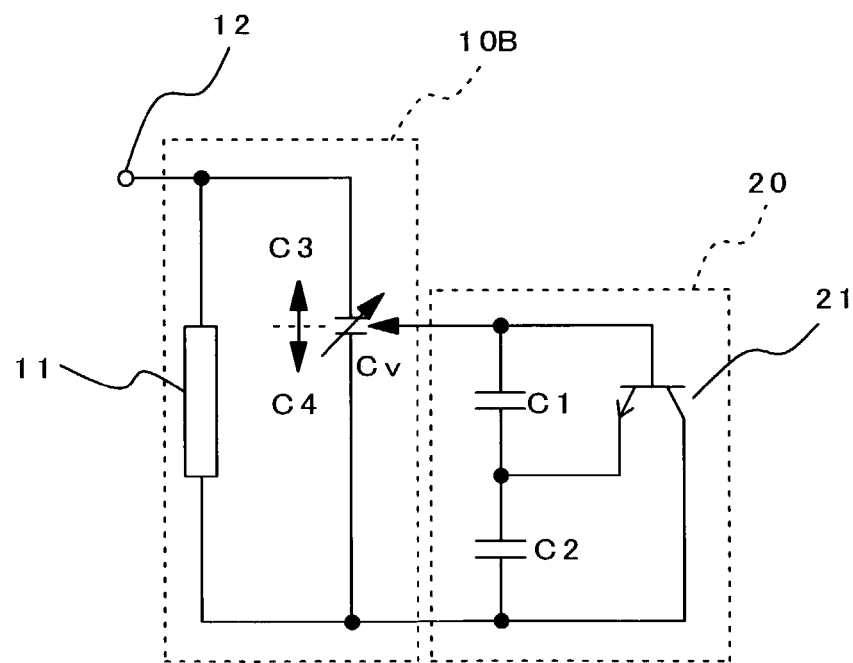
FIG. 8 is a circuit diagram of an oscillator according to a third embodiment of the present invention.

FIG. 8 is a circuit diagram of an oscillator according to a third embodiment of the present invention. A variable capacitor Cv of a resonance circuit 10B is substituted for the capacitors C3 and C4 shown in FIG. 3. The variable capacitor Cv is connected across the main resonance element circuit 11. One end of the variable capacitor Cv is connected to the frequency control terminal 12. The variable capacitor Cv has an intermediate point, at which the capacitance of the variable capacitor Cv is divided into two parts. One of the two divided parts forms the aforementioned capacitor C3, and the other forms the aforementioned capacitor C4. Therefore, the circuit shown in FIG. 8 has the same function and effects as those of the circuit shown in FIG. 3. In addition, by varying the capacitance of the variable capacitor Cv, the base voltage of the transistor 21 can be adjusted. That is, by changing the capacitance ratio of the capacitor C3 to the capacitor C4, the base voltage can be arbitrarily adjusted.

The variable capacitor Cv may be realized by an MIM capacitor or interdigital capacitor. For instance, two interdigital capacitors are connected in series so that the single variable capacitor can be formed. The intermediate node of the two interdigital capacitors is connected to the base of the transistor 21. The interdigital capacitor is realized so that a pair of comb-like electrodes is formed on a substrate formed of a semiconductor such as GaAs or Si. The pair of comb-like electrodes is arranged in an interdigital formation. The comb-like electrodes may be trimmed by laser in order to change the capacitance. By changing the capacitance of at least one of the two interdigital capacitors, it is possible to change the voltage-dividing ratio of the output voltage of the main resonance element circuit 11.

(Fourth Embodiment)

Figure 9:
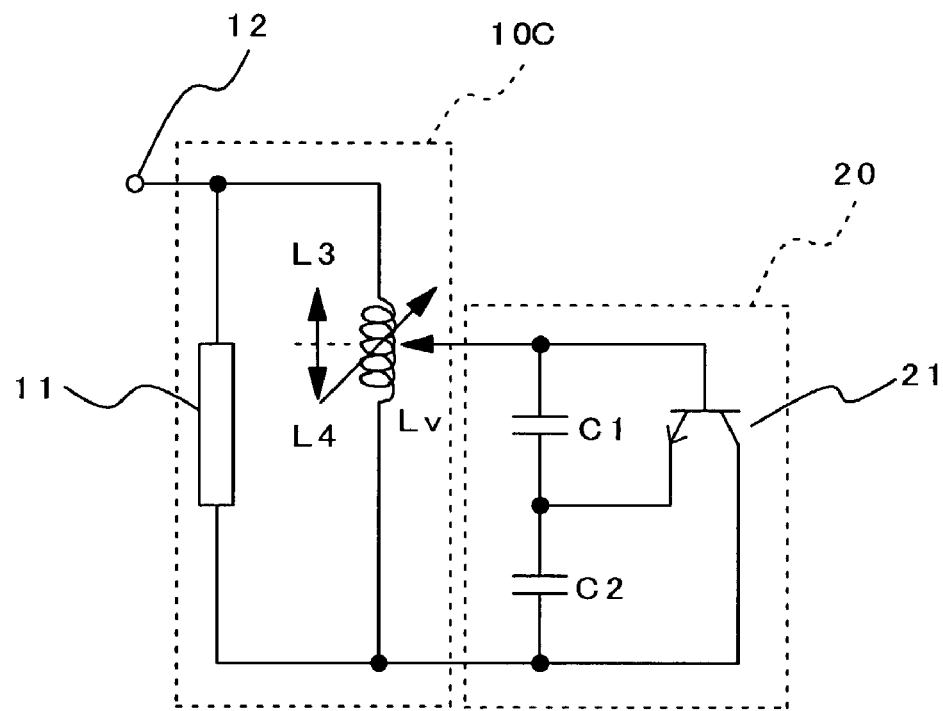
FIG. 9 is a circuit diagram of an oscillator according to a fourth embodiment of the present invention.

FIG. 9 is a circuit diagram of an oscillator according to a fourth embodiment of the present invention, in which a single variable inductor Lv of a resonance circuit 10C is substituted for the inductors L3 and L4 shown in FIG. 6. The variable capacitor Cv is connected across the main resonance element circuit 11. One end of the variable inductor Lv is connected to the frequency control terminal 12. The variable inductor Lv has an intermediate point, at which the inductance of the variable inductor Lv is divided into two parts. One of the two divided parts forms the aforementioned inductor L3, and the other forms the aforementioned inductor L4. Therefore, the circuit shown in FIG. 9 has the same function and effects as those of the circuit shown in FIG. 6. In addition, by varying the inductance of the variable inductor Lv, the base voltage of the transistor 21 can be adjusted. That is, by changing the inductance ratio of the inductor L3 to the inductor L4, the base voltage can be arbitrarily adjusted.

Figure 10:
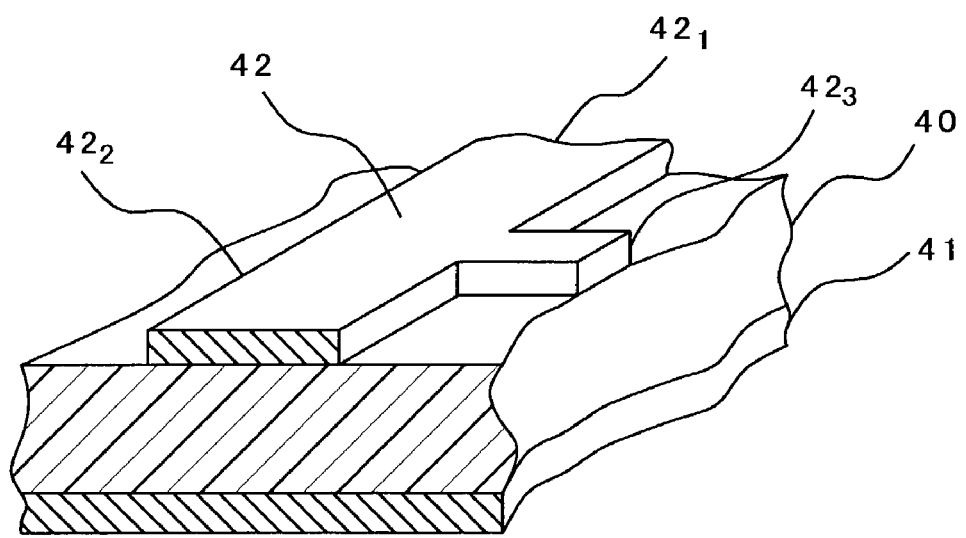
FIG. 10 is a perspective view o a variable inductance element.

FIG. 10 is a perspective view of the variable inductor Lv, which is formed by a microstrip line. A conductive member 41 is formed on a back surface of a dielectric substrate 40 made of, for example, silicon nitride $Si_3N_4$ or glass epoxy. A patterned line 42 is formed on a front surface of the dielectric substrate 40. A first portion $42_1$ of the line 42 is connected to the frequency control terminal 12 and the main resonance element circuit 11. A second portion $42_2$ of the line 42 is connected to the other end of the main resonance element circuit 11. A third portion $42_3$ is connected to the base of the transistor 21. By trimming the line 42 appropriately, the inductance values of the first portion $42_1$, and second portion $42_2$ can be changed. In this manner, the inductance ratio between the inductors L3 and L4 may be adjusted so that the optimal conduction for oscillation can be defined.

(Fifth Embodiment)

Figure 11:
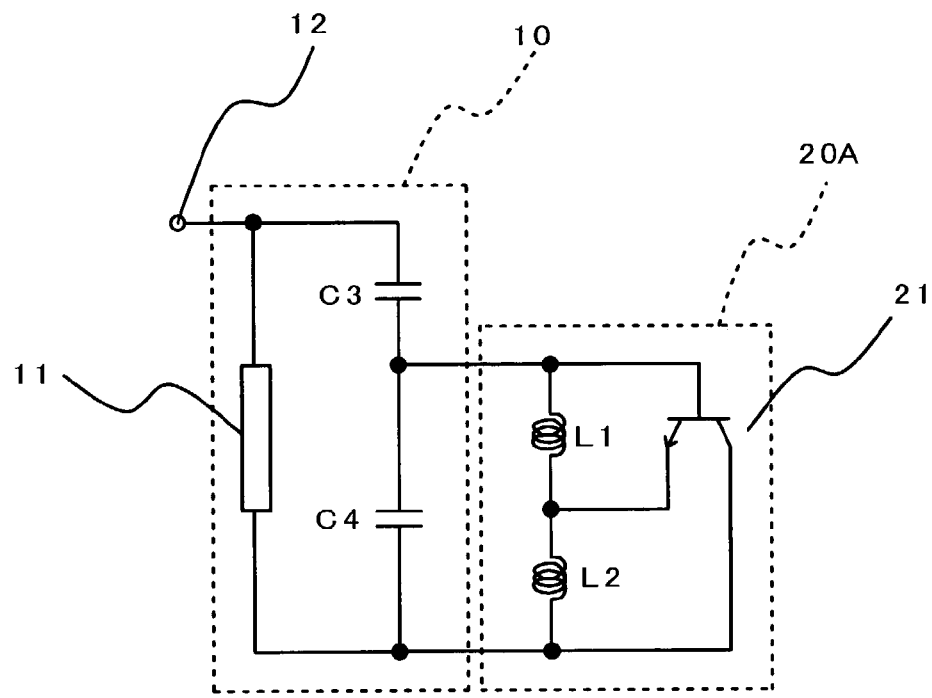
FIG. 11 is a circuit diagram of an oscillator according to a fifth embodiment of the present invention.

FIG. 11 is a circuit diagram of an oscillator according to a fifth embodiment of the present invention. The first through fourth embodiments of the present invention employ the Colpittz oscillators. In contrast, the oscillator shown in FIG. 11 is of Hartley type. In FIG. 11, the same reference numerals as those shown in the previously described figures refer to the same elements.

Inductors L1 and L2 shown in FIG. 11 are respectively substituted for the capacitors C1 and C2 of the Colpittz oscillator shown in FIG. 3. More particularly, the oscillator shown in FIG. 11 is configured as follows. The feedback circuit 20A is made up of the transistor 21 and the first inductor L1 coupling the emitter of the transistor 21 serving as the first terminal and the base thereof serving as the control terminal, and the second inductor L2 coupling the collector of the transistor 21 serving as the second terminal and the emitter. The resonance circuit 10 includes a series circuit (voltage dividing circuit) of the first capacitor C3 coupling one end of the main resonance element circuit 11 and the base of the transistor 21, and the second capacitor C2 coupling the other end of the main resonance element circuit 11 and the base of the transistor 21. The capacitors C3 and C4 shown in FIG. 11 have the same functions as those of the capacitors C3 and C4 shown in FIG. 3 and provide the same effects as those of the capacitors C3 and C4 shown in FIG. 3.

(Sixth Embodiment)

Figure 12:
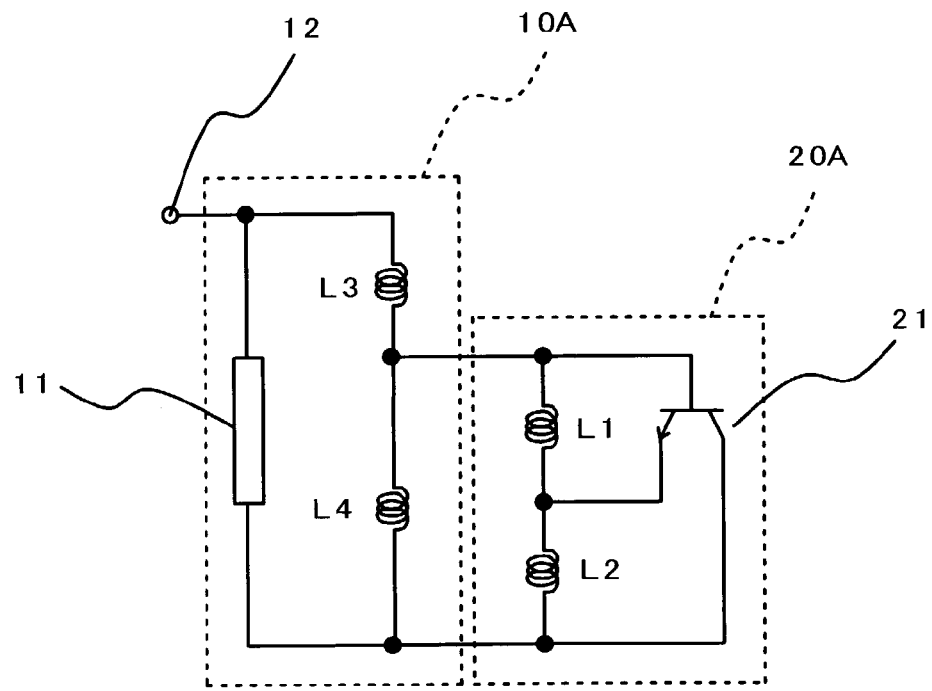
FIG. 12 is a circuit diagram of an oscillator according to a sixth embodiment of the present invention.

FIG. 12 is a circuit diagram of an oscillator according to a sixth embodiment of the present invention. The inductors L1 and L2 shown in FIG. 12 are respectively substituted for the capacitors C1 and C2 of the Colpittz oscillator shown in FIG. 6. More particularly, the oscillator shown in FIG. 12 is configured as follows. The feedback circuit 20A is made up of the transistor 21 and the first inductor L1 coupling the emitter of the transistor 21 serving as the first terminal and the base thereof serving as the control terminal, and the second inductor L2 coupling the collector of the transistor 21 serving as the second terminal and the emitter. The resonance circuit 10A includes a series circuit (voltage dividing circuit) of the third inductor L3 coupling one end of the main resonance element circuit 11 and the base of the transistor 21, and the fourth inductor L4 coupling the other end of the main resonance element circuit 11 and the base of the transistor 21. The inductors L3 and L4 shown in FIG. 11 have the same functions as those of the inductors L3 and L4 shown in FIG. 3 and provide the same effects as those of the inductors L3 and L4 shown in FIG. 6.

(Seventh Embodiment)

Figure 13:
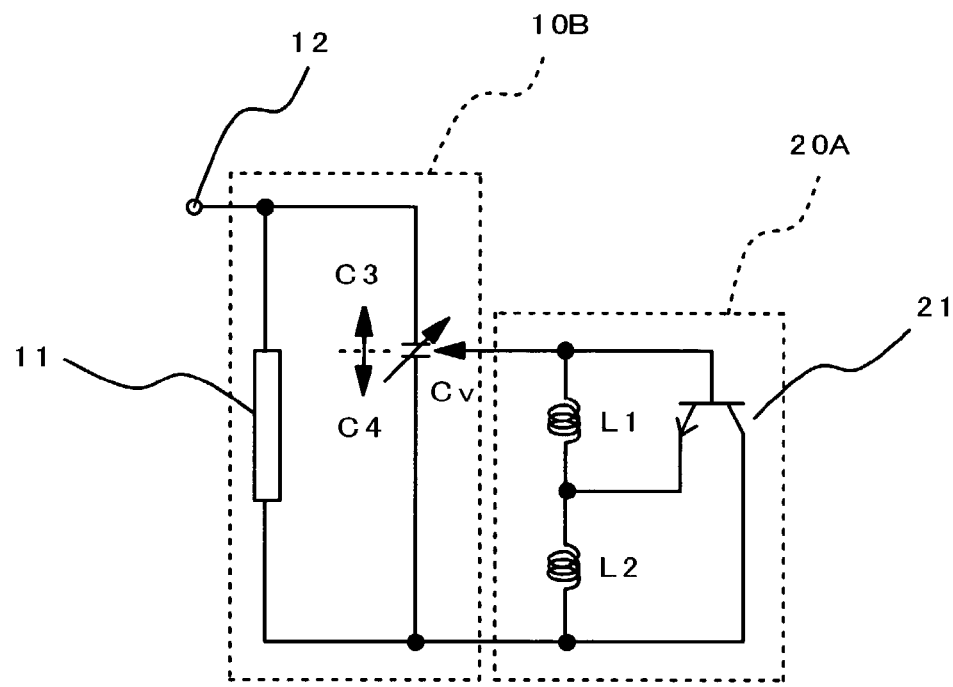
FIG. 13 is a circuit diagram of an oscillator according to a seventh embodiment of the present invention.

FIG. 13 is a circuit diagram of an oscillator according to a seventh embodiment of the present invention. The inductors L1 and L2 shown in FIG. 13 are respectively substituted for the capacitors C1 and C2 of the Colpittz oscillator shown in FIG. 8. More particularly, the oscillator shown in FIG. 13 is configured as follows. The feedback circuit 20A is made up of the transistor 21 and the first inductor L1 coupling the emitter of the transistor 21 serving as the first terminal and the base thereof serving as the control terminal, and the second inductor L2 coupling the collector of the transistor 21 serving as the second terminal and the emitter. The resonance circuit 10B includes the variable capacitor Cv connected across the main resonance element circuit 11. The variable capacitor Cv has the intermediate point, which is connected to the base of the transistor 21. The variable capacitor Cv shown in FIG. 13 have the same functions as those of the variable capacitor Cv shown in FIG. 8 and provide the same effects as those of the variable capacitor Cv shown in FIG. 8.

(Eighth Embodiment)

Figure 14:
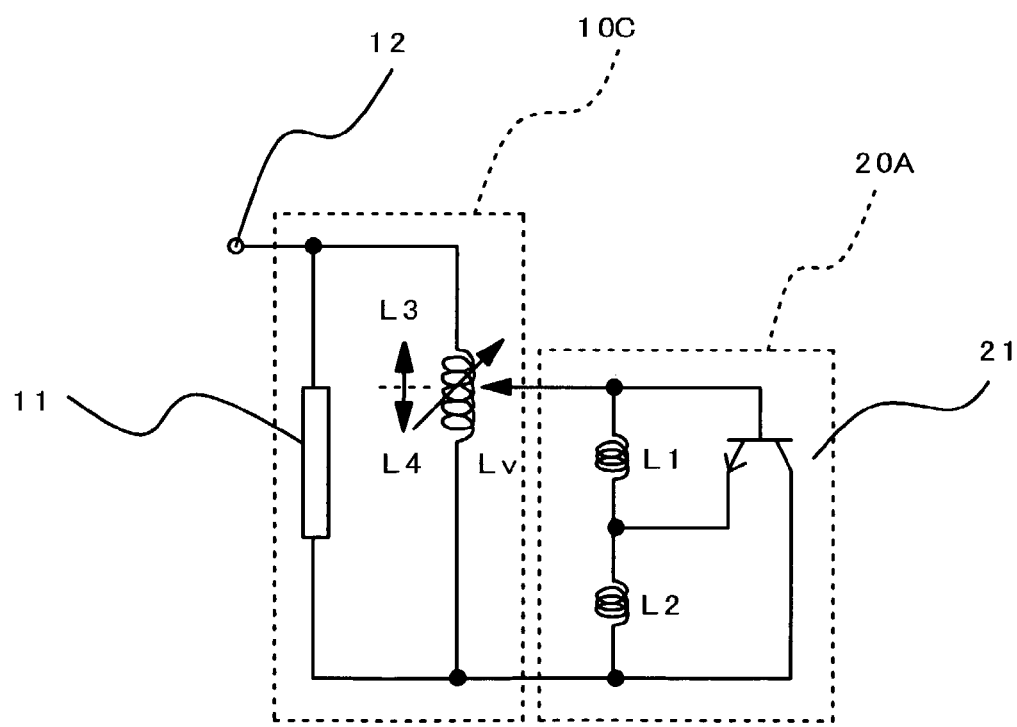
FIG. 14 is a circuit diagram of an oscillator according to an eighth embodiment of the present invention.

FIG. 14 is a circuit diagram of an oscillator according to an eighth embodiment of the present invention. The inductors L1 and L2 shown in FIG. 14 are respectively substituted for the capacitors C1 and C2 of the Colpittz oscillator shown in FIG. 9. More particularly, the oscillator shown in FIG. 14 is configured as follows. The feedback circuit 20A is made up of the transistor 21 and the first inductor L1 coupling the emitter of the transistor 21 serving as the first terminal and the base thereof serving as the control terminal, and the second inductor L2 coupling the collector of the transistor 21 serving as the second terminal and the emitter. The resonance circuit 10C includes the variable inductor Lv connected across the main resonance element circuit 11. The variable inductor Lv has the intermediate point, which is connected to the base of the transistor 21. The variable inductor Lv shown in FIG. 13 have the same functions as those of the variable inductor Lv shown in FIG. 9 and provide the same effects as those of the variable inductor Lv shown in FIG. 13.

The present invention is not limited to the specifically disclosed embodiments, and other embodiments, variations and modifications may be made without departing from the scope of the present invention. For example, the voltage dividing circuits may be formed by resistor elements other than the aforementioned capacitors or inductors. The voltage dividing circuits are not limited to the single variable capacitor Cv, variable inductor Lv or the series circuits composed of two capacitors or inductors connected in series, but may be made up of three or more capacitors or inductors connected in series in which a divided voltage available at an intermediate node of the series circuit is applied to the base or gate of the transistor.

The present invention is based on Japanese Patent Application No. 2002-137842 filed on May 13, 2002, the entire disclosure of which is hereby incorporated by reference.

What is claimed is:

1. An oscillator comprising:
   a resonance circuit; and
   a feedback circuit coupled to the resonance circuit and composed of a transistor having a control terminal, a first terminal, and, a second terminal,
   the resonance circuit comprising:
   a main resonance element circuit having an inductor; and
   a voltage dividing circuit that divides an output voltage of the main resonance element circuit available via the inductor and directly applies a divided voltage to the control terminal of the transistor in the feedback circuit,
   one end of the main resonance element circuit being provided by the inductor followed by the voltage dividing circuit and other end thereof being ground,
   the second terminal of the transistor being grounded via a capacitor, and
   the control terminal, the first terminal of the transistor, and the second terminal of the transistor being a base, an emitter, and a collector, respectively.

2. The oscillator as claimed in claim 1, wherein the voltage dividing circuit comprises multiple capacitors connected in series, and has an intermediate node connected to the feedback circuit.

3. The oscillator as claimed in claim 1, wherein the feedback circuit comprises:
   a first capacitor coupling a first terminal of the transistor and a control terminal thereof; and
   a second capacitor coupling the first terminal of the transistor and a second terminal thereof, and
   wherein the voltage dividing circuit comprises:
   a third capacitor coupling one end of the main resonance element circuit and the control terminal; and
   a fourth capacitor coupling another end of the main resonance element circuit and the control terminal.

4. The oscillator as claimed in claim 3, wherein said another terminal of the main resonance element circuit and the second terminal of the transistor are grounded.

5. The oscillator as claimed in claim 1, wherein the main resonance element circuit has a resonance frequency that is changed by an external frequency control voltage.

6. The oscillator as claimed in claim 1, wherein:
   the main resonance element circuit comprises an element having a capacitance that is changed by an external frequency control voltage; and
   the element is connected to the voltage dividing circuit.

7. The oscillator as claimed in claim 1, wherein the main resonance element circuit further comprises a variable capacitance element and a resistance element.

8. The oscillator as claimed in claim 1, wherein the main resonance element circuit comprises a vibrator.

9. The oscillator as claimed in claim 1, further comprising a buffer amplifier that amplifies an oscillation signal obtained from the feedback circuit.

10. The oscillator as claimed in claim 1, wherein the resonance circuit and the feedback circuit are formed on a semiconductor chip.

11. The oscillator as claimed in claim 1, wherein the resonance circuit and the feedback circuit are accommodated in a package.

* * * * *